United States Patent [19]
Scales et al.

[11] Patent Number: 6,126,382
[45] Date of Patent: Oct. 3, 2000

[54] APPARATUS FOR ALIGNING SUBSTRATE TO CHUCK IN PROCESSING CHAMBER

[75] Inventors: Martin N. Scales, San Jose; David A. Pechin, Santa Clara; Jeffrey C. Benzing, Saratoga, all of Calif.; R. Marshall Stowell, Lakeworth, Fla.

[73] Assignee: Novellus Systems, Inc., San Jose, Calif.

[21] Appl. No.: 08/980,125

[22] Filed: Nov. 26, 1997

[51] Int. Cl.[7] ................................................. G01N 21/30
[52] U.S. Cl. ...................... 414/754; 414/936; 414/757; 198/394
[58] Field of Search ..................... 414/754, 757, 414/774, 936; 198/379, 394; 118/728, 729, 730

[56] References Cited

U.S. PATENT DOCUMENTS

| | | | |
|---|---|---|---|
| H1463 | 7/1995 | Ota | 430/22 |
| 3,088,613 | 5/1963 | Wuesthoff | 414/757 |
| 3,628,650 | 12/1971 | Rouse | 198/394 |
| 3,654,000 | 4/1972 | Totah et al. | 156/17 |
| 3,731,017 | 5/1973 | Runtz | 200/11 |
| 3,890,508 | 6/1975 | Sharp | 198/394 |
| 3,982,627 | 9/1976 | Isohata | 198/394 |
| 3,999,021 | 12/1976 | Delp | 200/11 |
| 4,106,052 | 8/1978 | Schierz | 357/72 |
| 4,213,117 | 7/1980 | Kembo et al. | 340/146.3 |
| 4,311,427 | 1/1982 | Coad et al. | 198/394 |
| 4,413,186 | 11/1983 | Uema | 250/491.1 |
| 4,533,033 | 8/1985 | Van Wegen | 414/757 |
| 4,564,764 | 1/1986 | Yasuda et al. | 250/491.1 |
| 4,566,796 | 1/1986 | Leebrick | 356/401 |
| 4,657,475 | 4/1987 | Ohtsuji et al. | 198/394 |
| 4,713,551 | 12/1987 | Layman et al. | 250/561 |
| 4,770,533 | 9/1988 | Suwa | 356/375 |
| 4,777,374 | 10/1988 | Nakata et al. | 250/548 |
| 4,794,648 | 12/1988 | Ayata et al. | 382/8 |
| 4,806,773 | 2/1989 | Hiraga et al. | 250/548 |
| 4,819,167 | 4/1989 | Cheng et al. | 364/167.01 |
| 4,831,274 | 5/1989 | Kohno et al. | 250/563 |
| 4,870,289 | 9/1989 | Sato et al. | 250/548 |
| 4,943,767 | 7/1990 | Yokota | 324/158 F |
| 5,083,035 | 1/1992 | Pecen et al. | 250/561 |
| 5,118,957 | 6/1992 | Kawashima et al. | 250/561 |
| 5,148,036 | 9/1992 | Matsugu et al. | 250/548 |
| 5,212,116 | 5/1993 | Yu | 437/228 |
| 5,222,305 | 6/1993 | Guth | 33/614 |
| 5,235,291 | 8/1993 | Shiga | 331/44 |
| 5,248,024 | 9/1993 | Yokosuka | 198/341 |
| 5,264,918 | 11/1993 | Kagami | 356/400 |
| 5,321,495 | 6/1994 | Hagiwara et al. | 356/237 |
| 5,401,669 | 3/1995 | Falster et al. | 437/12 |
| 5,418,613 | 5/1995 | Matsutani | 356/375 |
| 5,437,757 | 8/1995 | Rice et al. | 118/728 |
| 5,438,209 | 8/1995 | Yamamoto et al. | 250/559.29 |
| 5,452,078 | 9/1995 | Cheng | 356/150 |
| 5,483,079 | 1/1996 | Yonezawa | 250/559.29 |
| 5,483,349 | 1/1996 | Suzuki | 356/401 |
| 5,500,641 | 3/1996 | Roberts | 414/757 |
| 5,840,129 | 11/1998 | Saenz et al. | 414/757 |

*Primary Examiner*—Gregory A. Morse
*Attorney, Agent, or Firm*—Skjerven, Morrill, MacPherson LLP; David E. Steuber

[57] ABSTRACT

A passive mechanism for centering a wafer on a chuck and with respect to a backside exclusion gas ring includes a plurality of wheels that are rotatably mounted in a circular pattern at the top surface of a chuck. The axis of rotation of each wheel is parallel to the top surface of the chuck and perpendicular to a radius extending outward from the centerpoint of the chuck surface. When a wafer is placed on the chuck, its edge contacts the wheels and, by its own weight, the wafer moves toward the center of the chuck, thereby centering itself. The wafer either slides on the wheels or, if the frictional force between the wafer and one or more of the wheels is great enough, the wafer causes the wheel to turn. The wheels may be mounted on the chuck, a carrier ring or a wafer transfer arm for moving wafers between processing stations. In one embodiment the alignment wheels are mounted on a carrier ring, and a second alignment mechanism aligns the carrier ring to the chuck.

27 Claims, 19 Drawing Sheets

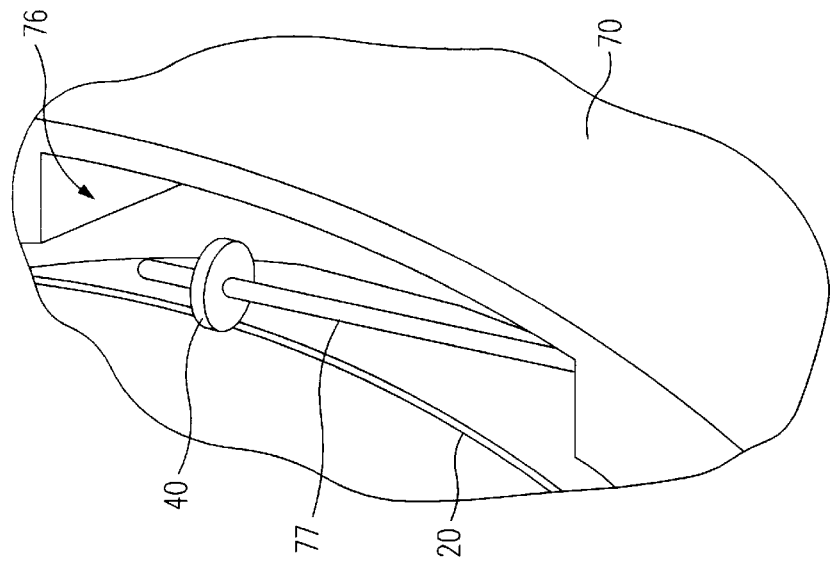
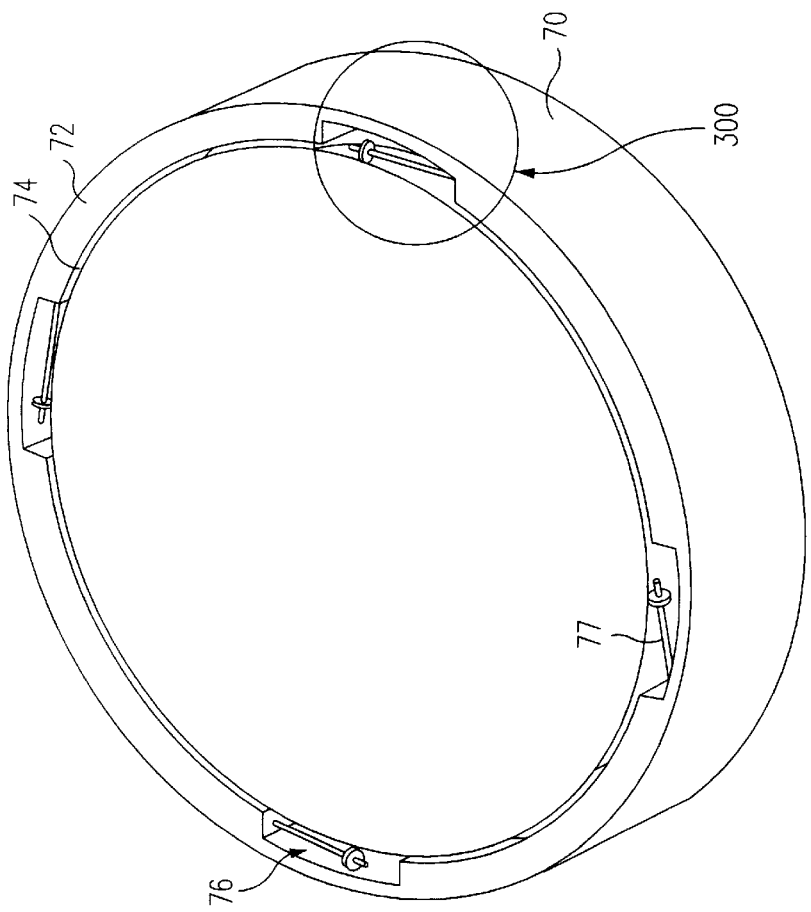
FIG. 7B
FIG. 7A

APPARATUS FOR ALIGNING SUBSTRATE TO CHUCK IN PROCESSING CHAMBER

CROSS-REFERENCES

The present application is related to co-owned U.S. Pat. No. 5,238,499, filed May 25, 1991, entitled "GAS-BASED SUBSTRATE PROTECTION DURING PROCESSING," U.S. Pat. No. 5,374,594, filed Jan. 22, 1993, entitled "GAS-BASED BACKSIDE PROTECTION DURING SUBSTRATE PROCESSING," U.S. Pat. No. 5,578,532, filed Aug. 23, 1994, entitled "WAFER SURFACE PROTECTION IN A GAS DEPOSITION PROCESS," and U.S. Pat. No. 5,620,525, filed Aug. 23, 1994, entitled "APPARATUS FOR SUPPORTING A SUBSTRATE AND INTRODUCING GAS FLOW PROXIMATE TO AN EDGE OF THE SUBSTRATE," each of which is incorporated herein by reference in its entirety.

BACKGROUND OF THE INVENTION

1. Field of the Invention

This invention relates to aligning a substrate with respect to another body and in particular to centering a wafer on a chuck in a processing chamber. This invention is especially related to centering a wafer in a chemical vapor deposition (CVD) or plasma-enhanced chemical vapor deposition (PECVD) process chamber which is equipped with a carrier ring, which could be an exclusion gas ring for preventing deposition on the backside and peripheral edges of the wafer, particularly equipment for depositing a layer of tungsten, copper, aluminum or another conductor. This invention is also applicable to other types of processing equipment such as physical vapor deposition (PVD) and etching equipment such as that used in reactive ion etching (RIE).

2. Description of Related Art

In semiconductor processing, before a film of material is formed on a wafer, the wafer is customarily placed on a pedestal, frequently referred to as a chuck, in a process chamber. One of the methods of forming a film on the wafer is chemical vapor deposition (CVD), which is a gas reaction process commonly used in the semiconductor industry. The CVD process is based on the thermal, plasma, or thermal and plasma decomposition and reaction of selected gases. The most widely used CVD films are silicon dioxide, silicon nitride, and polysilicon, although a wide variety of other CVD films are suitable for use as insulators, dielectrics, semiconductors, conductors, superconductors and magnetics.

In the deposition process, the film is deposited on the front side of the wafer. However, under certain circumstances, film may be formed on the back side as well as on the edge of the wafer, which poses a problem. That is, the back side and the edge become only partially coated, and these partial coatings tend to peel and flake easily for some types of materials, introducing particulates into the process chamber during deposition and subsequent handling steps. This in turn lowers the quality of the processed wafers, resulting in a lowered yield.

Several approaches have been developed to prevent such partial coating on the back side and the edge, some of which are described in the above-referenced U.S. Pat. No. 5,578,532. According to one such approach, as shown in FIG. 1, a wafer 20 is placed on a chuck 200, and a carrier ring 30 is placed on top of wafer 20, covering the wafer's edge. In this case carrier ring 30 is an exclusion gas ring. The exclusion gas is introduced beneath the wafer and flows around the edge of the wafer 20 and through a gap between the exclusion ring 30 and the wafer 20 to prohibit a film from forming on the edge and the backside of wafer 20. For this process to be successful, the wafer 20 must be centered accurately with respect to both the chuck 200 and the exclusion ring 30.

FIG. 2A is a top view of an illustrative chuck 200, containing integral gas lines and gas grooves to facilitate the introduction of the exclusion gas from within chuck block 202. An annular gas groove 210 is provided within a peripheral region 211 of top surface 15 of chuck block 202. Gas groove 210 intersects ten (10) radial gas lines 212a–212j for distributing gas to the backside of the wafer to be processed. Radial gas lines 212a–212j are shown as dashed lines in FIG. 2A, and selectively in the cross sectional view of FIG. 2B. Gas lines 212a–212j extend sufficiently into chuck block 202 to intersect a respective one of the ten vertical bores 216a–216j, which extend from the bottom surface of chuck block 202 (FIG. 2B). Gas lines 212a–212j are plugged by respective plugs 218a–218j.

A second set of radial gas lines 214a–214c are bored in chuck block 202 for distributing backside gas to holes 107a–107c (FIG. 2C), which accommodate lift pins (not shown) which are used to lift the wafer from the surface 15 of the chuck 200. Radial gas lines 214a–214c are likewise shown as dashed lines in FIG. 2A, and selectively in the cross sectional view of FIG. 2C. Gas lines 214a–214c are plugged by respective plugs 222a–222c.

Holes 205a–205h, radial grooves 206a–206h and 209a–209q, and circular grooves 208a–208c form an interconnected system for providing a vacuum to clamp the wafer to the top surface 15 of chuck 200. Circular grooves 208a–208c and 210 are concentric, and groove 210 for the exclusion gas is located outside of the outermost groove 208c for the vacuum clamping system.

For the exclusion gas to perform satisfactorily, wafer 20 must be accurately centered with respect to the circular exclusion gas groove 210. If the wafer is misaligned and part of it is thereby placed beyond the influence of the deposition control gas from the groove 210, partial film coating on the back side and the edge cannot be prevented.

Moreover, if the wafer is misaligned, a part of the front side may remain uncoated, or the thickness of the coating may be uneven. An important objective in wafer processing is to produce a processed wafer whose front side coating is as uniform as possible. Proper wafer centering before deposition is a key to achieving this objective.

Two basic techniques have been employed for centering wafers on a chuck: active and passive. The active technique typically utilizes a robot arm to place a wafer on a chuck. This is expensive and requires electricity to drive the robot motor. It is also difficult to implement, since slip, inertia and other factors causing inaccurate positioning have to be prevented over an extended period of repetition. Moreover, the circuitry in a robot arm will not withstand the caustic environment in the process chamber.

Passive techniques typically allow a wafer to settle into a centered position by its own weight. One example is illustrated in FIGS. 3A, 3B and 3C. A circular ramp 17 is slanted toward the center of the chuck's top surface 15. FIGS. 3B and 3C show the cross-section of ramp 17. The reference label 3B in FIG. 3A indicates the cross-section shown in FIGS. 3B and 3C. FIG. 3B shows a cross-sectional view of the ramp 17 with an uncentered wafer 20 which straddles a part of ramp 17. Wafer 20 is supposed to slide down ramp 17 to the centered position shown in FIG. 3C.

A problem with this type of arrangement is that friction between the wafer's edge and the ramp may prevent the wafer from sliding. This friction can increase as the surfaces inside a process chamber become coated with the deposition material.

The inside of the process chamber is subjected to a very caustic environment, since a corrosive cleanser, e.g., fluorine, is typically used to eliminate any remnants of deposition material inside the process chamber. Therefore, a wafer centering mechanism should also be anticaustic.

Accordingly, a wafer centering mechanism that is effective, inexpensive to implement and resistant to a caustic environment is desired.

SUMMARY

According to this invention, a substrate such as a semiconductor wafer is properly aligned with respect to another object by means of a plurality of alignment wheels. The alignment wheels are mounted so as to rotate about horizontal axes and are positioned such that the edges of the wheels define a shape which is substantially congruent with the shape of the substrate. The reference to "edges" refers to the edges of the wheels that face inward, i.e., generally towards the inside of the shape that is defined by the wheels as described above. The substrate is brought to a position above the alignment wheels which approximates the correct alignment and is lowered until the peripheral edges of the substrate come into contact with the alignment wheels. The alignment wheels then rotate about their axes and thereby guide the substrate to a rest position where it is proper aligned. The alignment wheels may be mounted to various components, including the chuck itself, a transfer arm, or a carrier ring (which may function as a gas exclusion ring).

When the substrate reaches the alignment wheels, it either slides along the peripheral surfaces of the wheels or causes the wheels to rotate, or both. Typically, the substrate will make contact initially with at least two of the alignment wheels. Allowing for both sliding and rotational movement is desirable, since at any given time one of the two mechanisms works to achieve the proper alignment of the substrate. In some embodiments the wheels are positioned such that there is a small gap between the wheels and the edge of the substrate when the substrate is sufficiently well aligned (e.g., for a circular substrate the distance between the center of each wheel and the centerpoint of the chuck is slightly greater than the sum the of radii of the substrate and the wheel).

A significant advantage of this arrangement is that, because the angle of contact between the substrate and the wheels changes rapidly from horizontal to vertical as the substrate is aligned, the substrate needs to travel only a relatively small vertical distance in the alignment process. This is advantageous because there is often a limited amount of space above the chuck in the processing chamber.

In one group of embodiments, a chuck for supporting a circular semiconductor wafer is provided with a plurality of wheels positioned in a circle such that the wheels contact a peripheral edge of the wafer and thereby center the wafer with respect to the chuck and/or an exclusion gas ring. Each of the wheels is mounted so as to rotate about an axis which is generally horizontal and perpendicular to a radial line extending from the centerpoint of the chuck. The wheels can be positioned on the chuck in various ways. For example, in one embodiment each of the wheels is anchored to the chuck by means of a wheel holder which includes an axle. In other embodiments the wheels are rotatably mounted on resilient members which allow the wheels to move vertically and/or horizontally. For example, the length of the axles which hold the wheels can be increased to the point where they are capable of flexing either horizontally or both horizontally and vertically. In yet another embodiment, the wheels are held on axles that are attached to the chuck at only one end.

In another group of embodiments the wafer is centered with respect to an exclusion ring on a wishbone-shaped arm that can be used to transfer the wafer between processing stations. Attached to the arm are a plurality of wheels which are positioned in a circle as described above. As the wafer is lowered into an approximate position on the arm the wheels function as described above to position the wafer accurately with respect to the arm. The exclusion ring is provided with a plurality of pins which engage slots in the arm to position the exclusion ring accurately with respect to the arm and to ensure that the wafer is centered with respect to the exclusion ring. Using a combination of pins and slots as a means of positioning the ring on the arm allows for differential thermal expansion between the ring and arm. The chuck has slots into which the wheels retract after the arm has lowered the wafer to the surface of the chuck.

In yet another embodiment, a plurality of alignment wheels are mounted to a carrier ring, which also includes a plurality of resting surfaces for holding the wafer after it has been centered with respect to the carrier ring. In addition, a second alignment mechanism is used to align the carrier ring to the chuck. In one embodiment, a second set of alignment wheels are mounted to the chuck, in pairs, on axles which are parallel to radii extending from the center of the chuck. Attached to the carrier ring are alignment surfaces which contact the second set of alignment wheels and correctly align the carrier ring with respect to the chuck. The carrier ring is properly aligned with the chuck by the time that the wafer has made contact with the supporting surface of the chuck, and it can be clamped to the chuck (e.g., by a vacuum-clamping system). In this embodiment, a set of rotatable balls are provided on the resting surfaces of the carrier ring, which allows for additional lateral shifting of the wafer as it comes to rest in a properly aligned position.

Embodiments of this invention may be constructed entirely of mechanical components and operate automatically, without the need for sensors or control elements of any kind. They can be manufactured out of materials that can withstand and operate in extreme environments such as those typically found in semiconductor processing systems, including environments which include high temperatures and highly corrosive gases. They typically require no special skills to assemble or place into operation, and can be expected to last the life of the processing system with which they are used. They are fully compatible with all of the requirements of substrate processing, including minimal sub-micron particulate generation, no chemical contaminant generation, reasonable cost, and high reliability with no scheduled or required maintenance.

While the invention is advantageously used to center a circular semiconductor wafer, this invention can be used to accurately position any type of substrate, whether it be circular, square or some other shape.

BRIEF DESCRIPTION OF THE DRAWINGS

The invention will be more readily understood by reference to the following drawings, in which like elements are identified by the same reference numeral.

FIG. 7A illustrates a perspective view of a third embodiment which includes a plurality of wafer-centering wheels on axles attached to the chuck at only one end.

FIG. 7B shows an enlarged view of one of the wheels shown in FIG. 7A.

DETAILED DESCRIPTION

Figure 4:
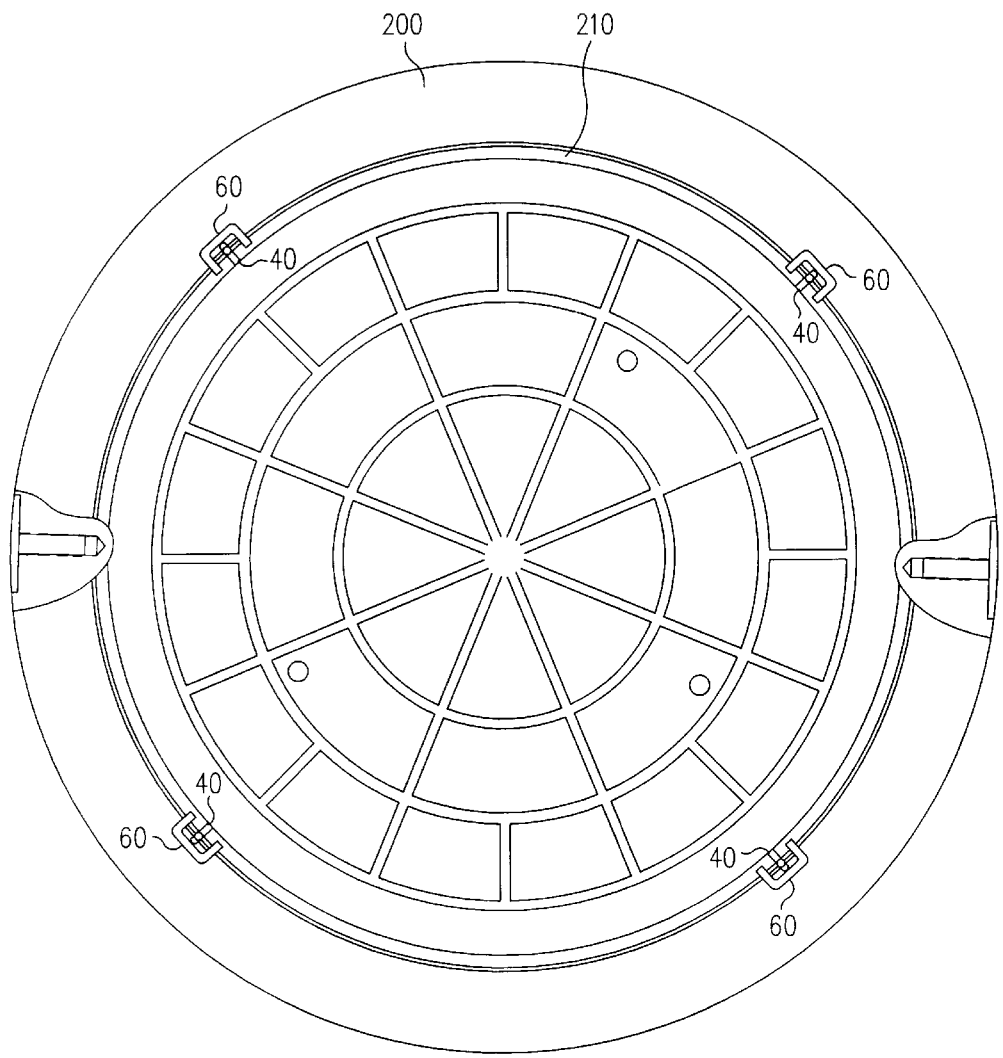
FIG. 4 illustrates a top view of a first embodiment of the invention which includes a chuck having a plurality of wafer centering wheels on wheel holders.

FIG. 4 illustrates a top view of a chuck 200 on which four wafer-centering wheels 40 are mounted. Each of wheels 40 is mounted on chuck 200 by means of a wheel-holder 60. As shown, wheels 40 are arranged at 90 degree intervals in a circular pattern near the exclusion gas groove 210.

Figure 5A:
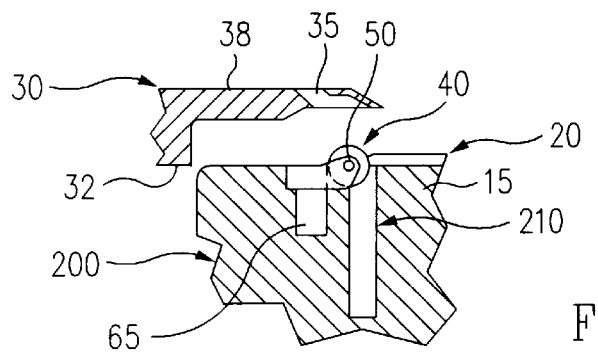
FIGS. 5A and 5B illustrate detailed cross-sectional views of a wheel and wheel holder.
Figure 5B:
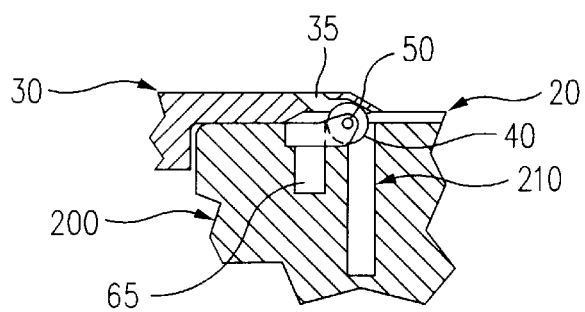
Figure 5C:
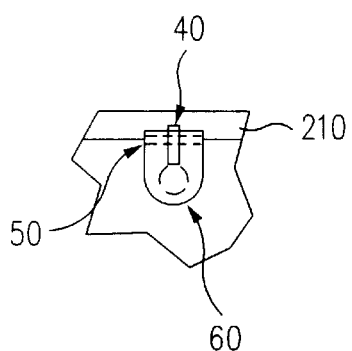
FIG. 5C illustrates a top view of the wheel and wheel holder.

FIGS. 5A and 5B are detailed cross-sectional views of one of wheels 40. Wheels 40 are rotatable on axles 50, and each axle 50 is supported at its ends by a wheel holder 60. Wheel holders 60, typically made of aluminum, are attached to chuck 200 by means of pins 65 which are press-fitted into holes bored in chuck 200.

As seen in FIGS. 5A and 5B, for rotating wheels 40 to properly perform passive wafer centering, they are installed such that their top portions are slightly higher than the top surface 15 of chuck 200. In one embodiment wheels 40 are approximately 0.25" in diameter and extend approximately 0.10" above the top surface 15 of chuck 200. FIGS. 5A and 5B show exclusion ring 30 with a skirt 32 on its edge and an outside diameter large enough to cover the edge of chuck 200 at the same time forming a partial seal between its skirt and chuck 200. FIG. 5A shows exclusion ring 30 in a raised position above chuck 200, and FIG. 5B shows exclusion ring 30 resting on chuck 200 as it would be during processing of the wafer 20. The inner diameter of the exclusion ring 30 is small enough so that the ring covers the perimeter of a normal-sized wafer, e.g., an 8 inch wafer. Since the gap between the overlapping portion of the exclusion ring 30 must be small, cutouts 35 are made in exclusion ring 30 to accommodate the upper portions of wheels 40, as shown in FIG. 5B.

As is apparent from FIGS. 5A and 5B, an imaginary circle formed by connecting the central axes of the four wheels 40 has a diameter slightly larger than the diameter of the wafer 20.

Figure 1:
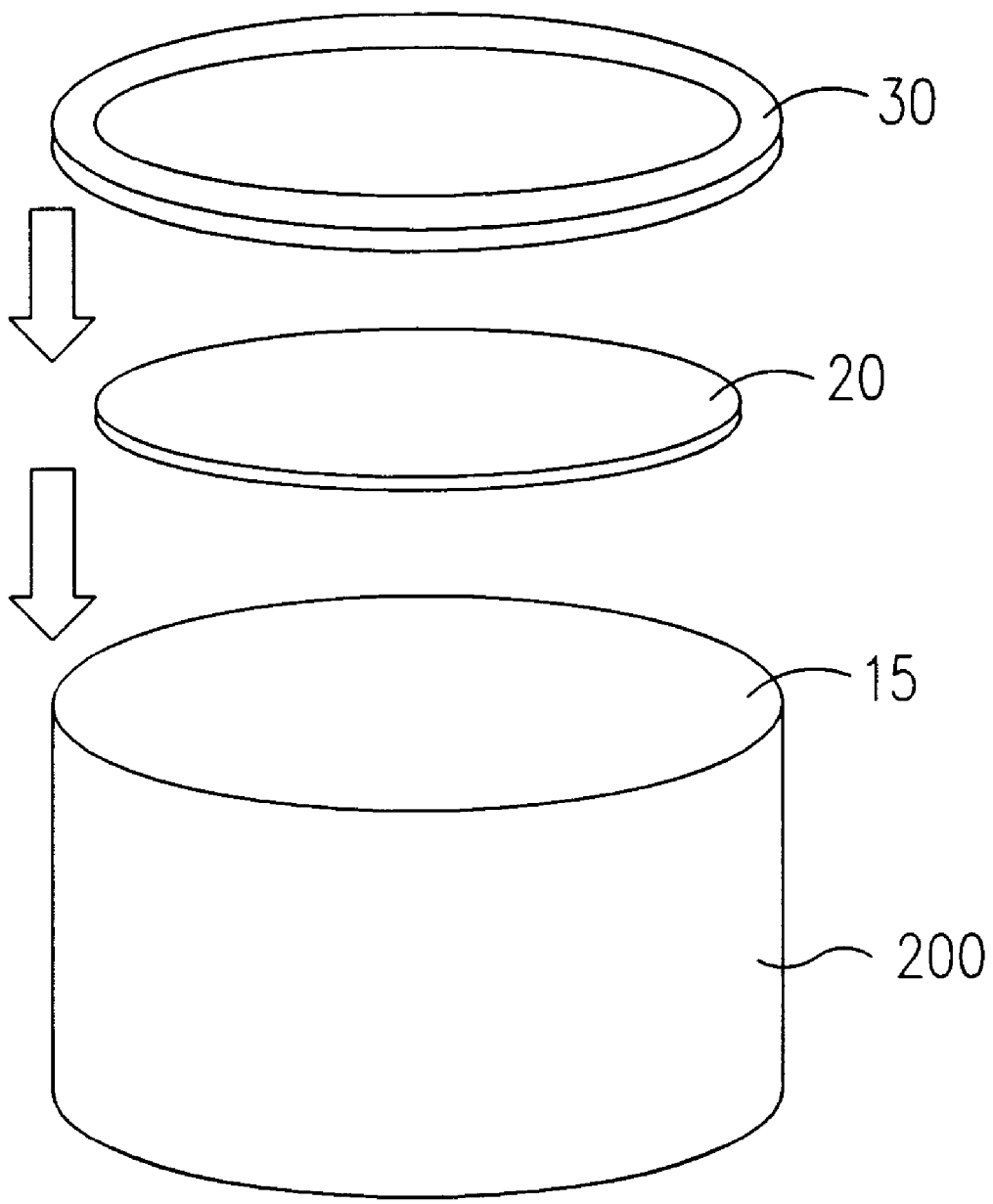
FIG. 1 illustrates generally the placement of a wafer and an exclusion ring on a chuck.
Figure 2A:
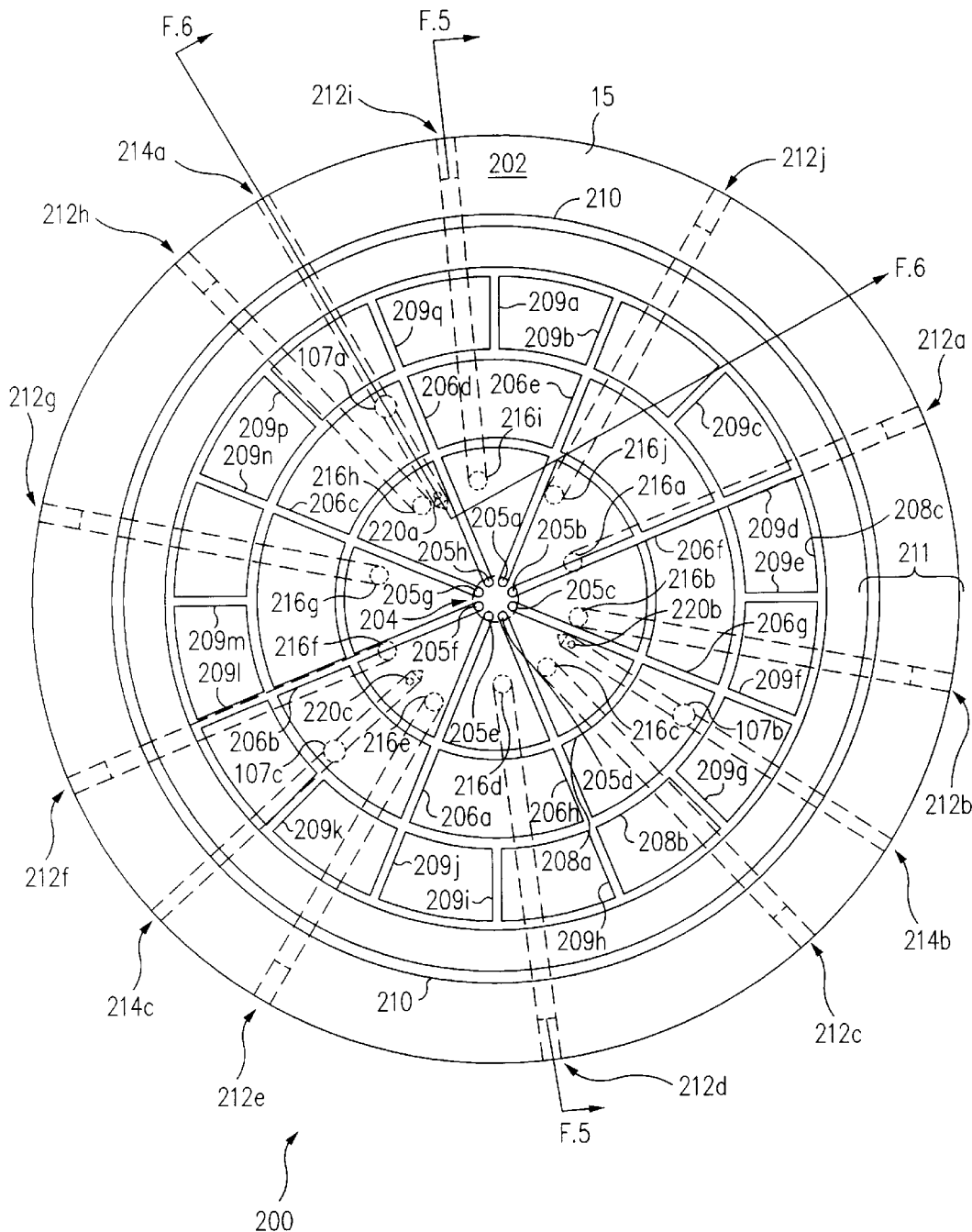
FIG. 2A illustrates a top view of a chuck, showing an exclusion gas system for reducing backside deposition and a vacuum system for clamping a wafer to the chuck.
Figure 2B:
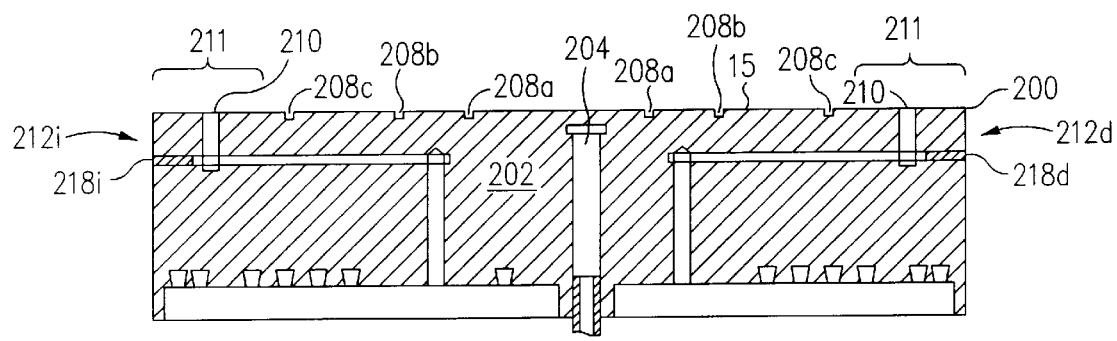
FIGS. 2B and 2C are views of the chuck shown in FIG. 2A taken at different radial cross sections.
Figure 2C:
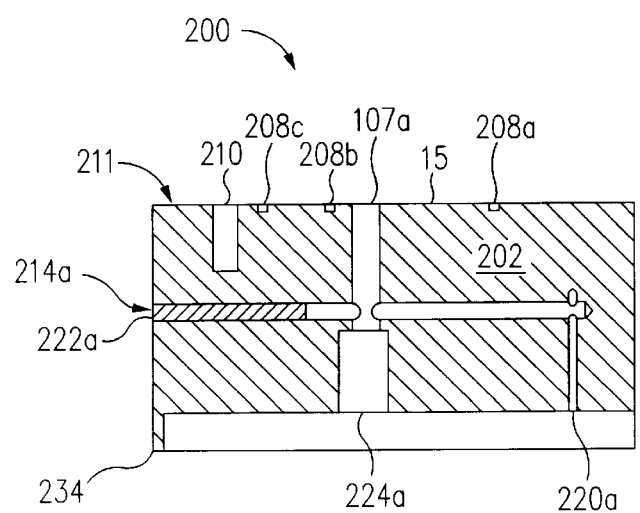
Figure 3A:
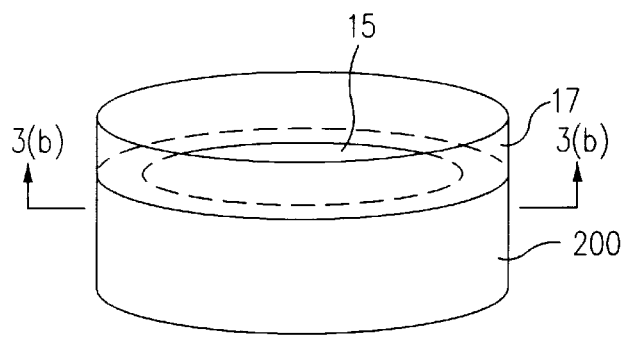
FIG. 3A illustrates a known passive wafer centering arrangement which includes a chuck and a circular ramp.
Figure 3B:
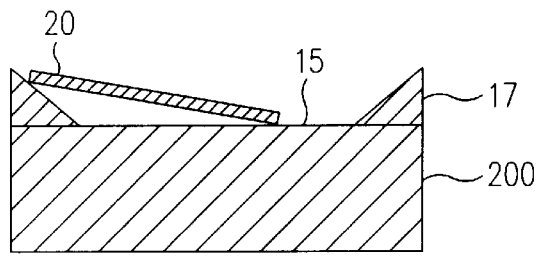
FIG. 3B illustrates a cross-sectional view of the ramp and chuck with an uncentered wafer straddling one side of the ramp.
Figure 3C:
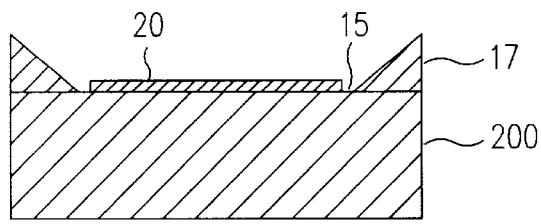
FIG. 3C illustrates cross-sectional view of the ramp and chuck when the wafer is centered on the top surface of the chuck.

Wafer 20 is typically transported to a position over chuck 200 by a transfer mechanism such as a paddle or fork. The wafer is then placed on lift pins which extend upward in holes 107a–107c (FIG. 2A). The lift pins then retract, lowering the wafer to the surface 15 of the chuck 200. If the wafer is positioned off-center, an edge straddles one or more of the wheels 40. If the frictional force between the wafer's edge and wheels 40 is sufficiently small, the wafer slides on the wheels without turning them. Otherwise, if the frictional force between wheels 40 and the wafer is too large for sliding, wheels 40 rotate. In either event, wafer 20 arrives at a position on the top surface 15 of the chuck 200 where it is accurately centered among the wheels 40 and where it can be clamped to the chuck by a vacuum or other type of clamping system. In one embodiment there is a small gap (approximately 0.005") between one or more of the wheels 40 when the wafer has been centered (i.e., the sum of the radii of the wafer 20 and wheels 40 is approximately 0.005" greater than the distance between the centerpoint of the chuck 200 and the central axis of each of wheels 40). The wheels must be located such that the appropriate capture diameter is provided when all parts (including the substrate) are at process temperature.

Permitting the wafer to either slide against or rotate the wheels is desirable, since, at any given time, one of the two mechanisms always works to achieve the centering. For example, while a wafer is sliding toward a central position on a chuck, if the frictional force between the wafer and one or more wheels becomes large enough to prevent further sliding, this frictional force will trigger rotation of the wheels, thereby continuing the centering process.

Figure 6:
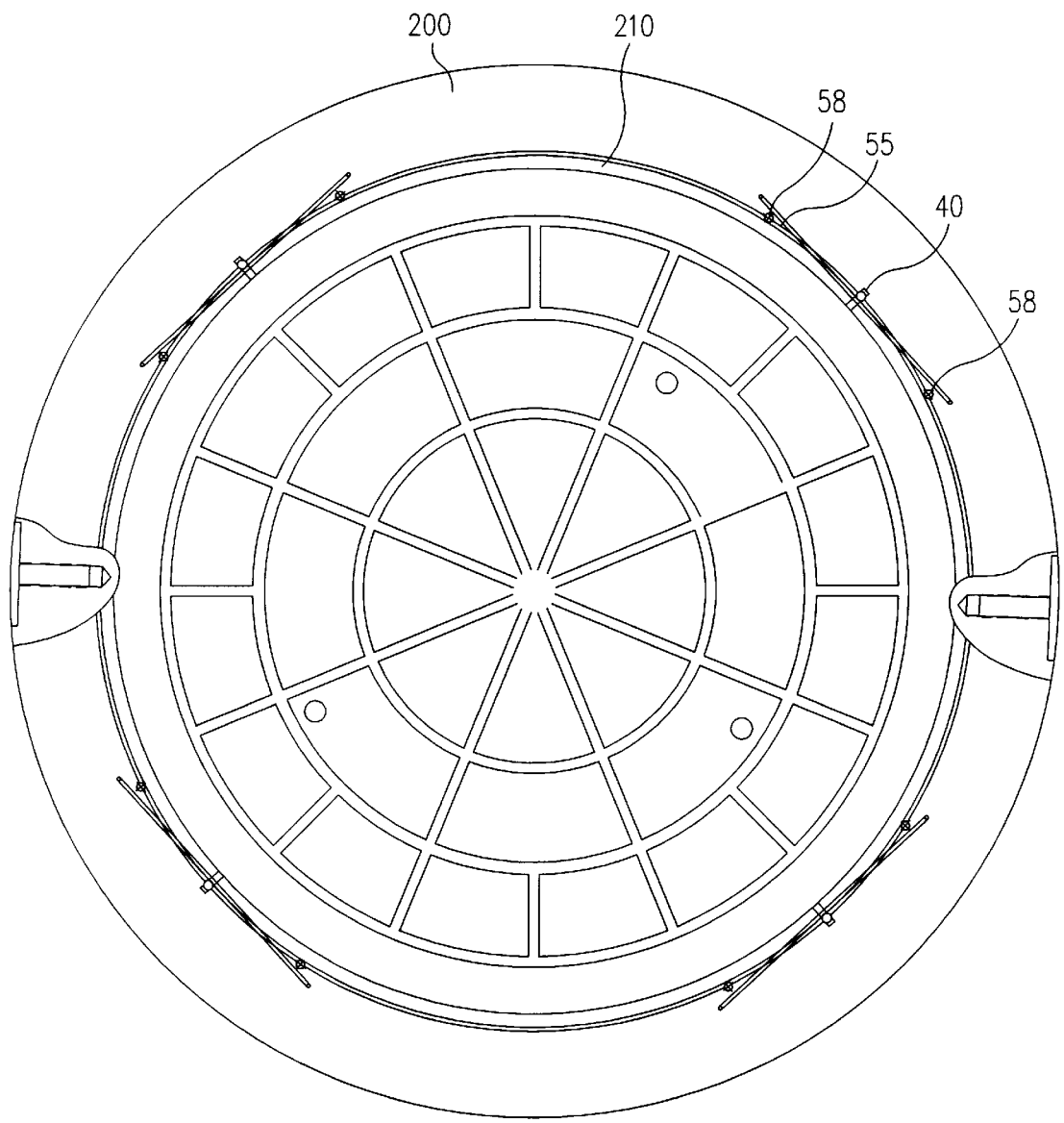
FIG. 6 illustrates a top view of second embodiment of the invention which includes a chuck having a plurality of wafer-centering wheels mounted on flexible axles.

As noted above, in the embodiment shown in FIGS. 4 and 5A–5C, cutouts 35 must be formed in the exclusion ring 30 to accommodate the top portions of the wheels 40 when the exclusion ring 30 is lowered into position. The need for cutouts 35 is avoided in the embodiment shown in the top view of FIG. 6, wherein the four wheels 40 are mounted at the midpoints of relatively long, flexible axles 55. The ends of the axles 55 are held by brackets 58 which are attached to chuck 200. In this embodiment the wafer is centered and clamped on chuck 200 in the manner described above. However, as the exclusion ring 30 is lowered, the lower surface of exclusion ring 30 presses downward on wheels 40, causing axles 55 to bend and allowing the exclusion ring to reach its required position with respect to the wafer. Since axles 55 can also bend outward, this embodiment can readily accommodate a wafer that is somewhat larger than normal. Axles 55 can be designed to allow wheels 40 to deflect a distance of 0.4 mm, for example.

In the embodiment shown in FIG. 7A, a chuck 70 is provided with a raised rim 72 on the outside of exclusion gas groove 74. Recesses 76 are formed in raised rim 72, and one end of each of axles 77 is press-fitted onto a hole bored in a side of a recess 76. The other end of axles 77 remains free, forming a cantilever. FIG. 7B is an enlarged view of one of the wheels 40 shown in FIG. 7(a). Wheels 40 are retained in position on the axles 77 by a known method, such as shoulders machined on the chuck. This embodiment allows the wheels to be easily deflected vertically by the weight of the exclusion ring and horizontally by the wafer as it arrives at a centered position on the chuck.

In the above embodiments, the axles are preferably made of sapphire capillary tubes, i.e., manufactured thin single-crystal aluminum oxide pipes. The outside diameter of the capillary tubes can be in the range 0.010"–0.100" (preferably 0.030") and the inside diameter can be in the range 0–0.080" (preferably 0.015"). Sapphire is used as a material for the axles for its several desirable properties: an appropriate spring constant, resistance to causticity, and very high hardness (therefore very little wear and low friction with no lubrication). Since a caustic substance such as fluorine is used after multiple processing sessions to rid the process chamber of any remaining deposition material, the inner structure of the process chamber must be formed of materials that can withstand a caustic environment.

For most of the same properties, sapphire is also preferred as a material for the wheels. In addition, a sapphire-to-sapphire contact has relatively low friction so that a sapphire wheel rotates smoothly on a sapphire axle in a classic jewel bearing arrangement.

In the embodiments previously described, the wafer-centering wheels are attached in one way or another to the chuck. This type of arrangement is particularly suitable for equipment which has only a single process station. For equipment containing multiple process stations where it is desired to transport a wafer between stations, the embodiment shown in FIGS. 8A–8C may be preferable. In this embodiment four pairs of wafer-centering wheels 100 are connected to a wishbone-shaped wafer transfer arm 102. Wheels 100 are arranged in a circular pattern and are connected to arm 102 by holders 104 which are fitted into holes bored in arm 102 and secured by cotter pins 106. Each of holders 104 terminates in a lip 108 which extends inwardly from the wheels 100. Each pair of wheels 100 is mounted on one of holders 104 by means of an axle.

Figure 8A:
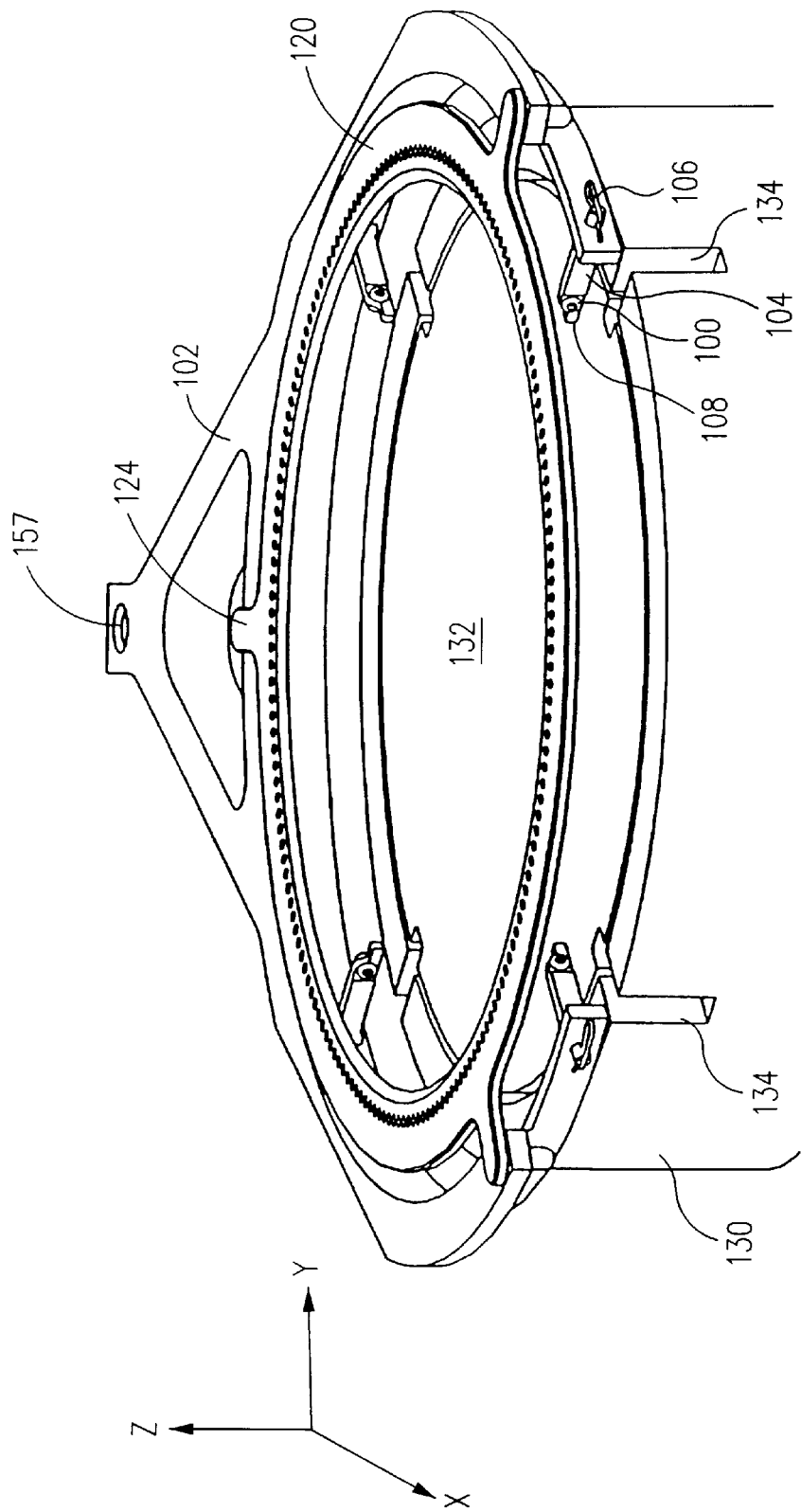
FIG. 8A illustrates a perspective view of a fourth embodiment which includes a wishbone-shaped wafer transfer arm having a plurality of wafer-centering wheels and an exclusion ring resting on the arm.
Figure 8B:
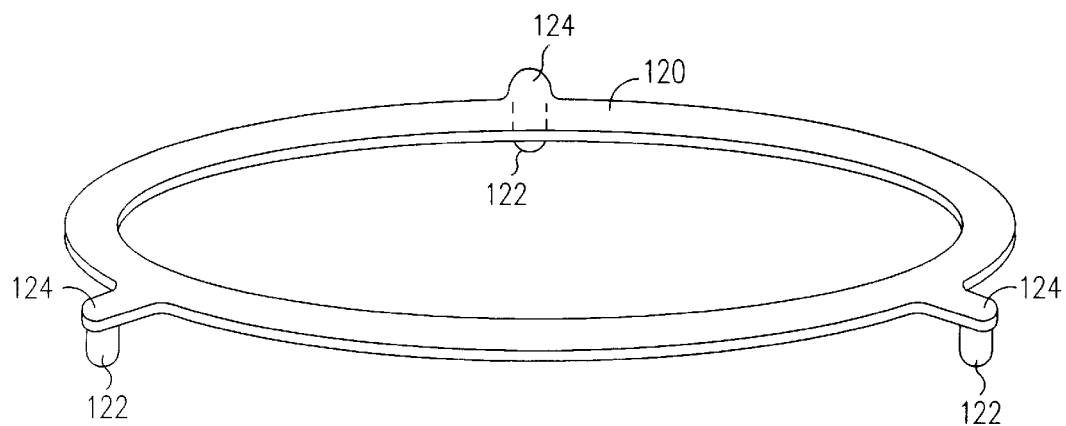
FIG. 8B illustrates a process gas exclusion ring used in the embodiment of FIG. 8A.
Figure 8C:
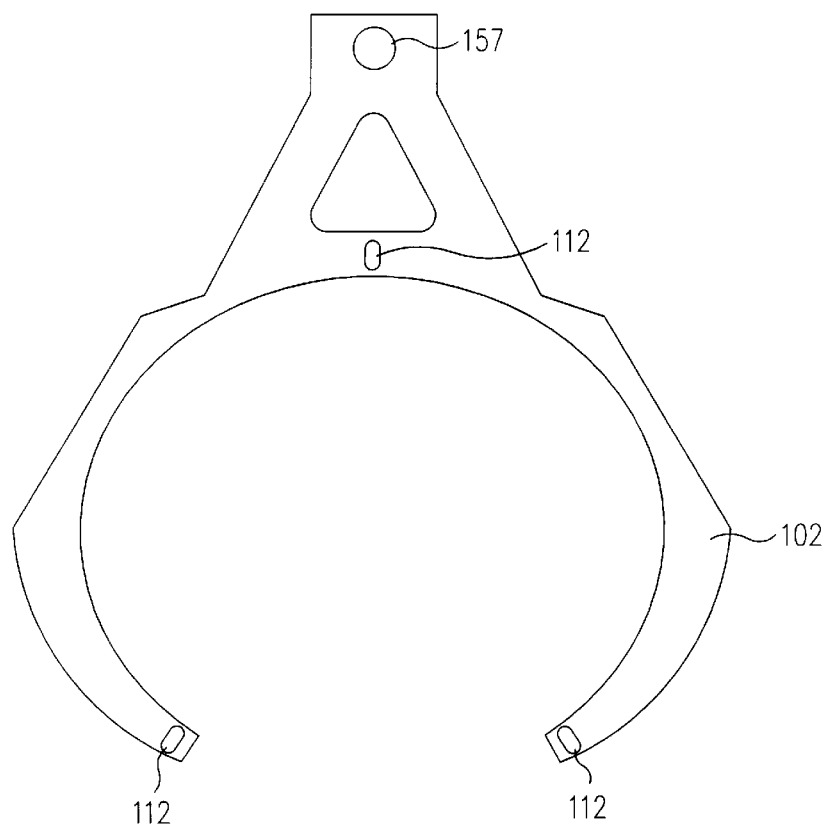
FIG. 8C illustrates a top view of the wafer transfer arm shown in FIG. 8A.

Process gas exclusion ring 120 is accurately positioned on the arm 102 by three guide pins 122 (FIG. 8B) which fit into slots 112 in arm 102 (FIG. 8C). As shown in FIG. 8B, the guide pins 122 protrude downward from outwardly extending handles 124. The exclusion ring 120 is centered onto the arm 102 by inserting the guide pins 122 into corresponding slots 112 in the arm 102 as shown in FIG. 8C. The slots 112 are elongated in the radial direction to provide accurate positioning of the exclusion ring 120 on the arm 102 even when these elements experience differential expansion or contraction as a result of temperature variations.

Wafer-transfer arm 102, holders 104, exclusion gas ring 120 and wheels 40 should be manufactured of materials that exhibit a resistance to harsh chemicals, a high modulus of elasticity, well-characterized thermal expansion coefficient, and very long wear life so that they maintain their mechanical tolerances in the high temperature, chemically corrosive environments used in semiconductor processing.

To load a wafer into transfer arm 102, arm 102 is raised in the z direction (see FIG. 8A). The wafer is moved to the center of the arm 102 by a paddle or a similar device (not shown), at a relative height below the arm 102 but above the wheels 100. Then, the paddle or other device is lowered and, in the manner described above, the wafer slides against or rotates wheels 100 until it reaches a position resting on lips 108. In this position the wafer is accurately positioned on wafer transfer arm 102 and accurately centered with respect to the exclusion ring 120. Next, the paddle or other device retracts from transfer arm 102 and transfer arm 102 is lowered towards the top surface 132 of chuck 130. As soon as the lips 108 reach the level of top surface 132, the wafer comes into contact with the top surface 132 and is clamped into position by a vacuum system or other means (not shown). Holders 104 continue downwards into slots 134 that are formed in chuck 130. Next, exclusion ring 120 comes to rest on the outer periphery of chuck 130, but pins 122 remain in slots 112 to ensure that exclusion ring 120 remains centered with respect to the wafer. In short, the length of guidance pins 122 is greater than the distance that the top surface of arm 102 falls below the peripheral surface of chuck 130. The vertical separation between the bottom surface of exclusion ring 120 and the top surface of the wafer is set by the peripheral surface of chuck 130.

To unload the wafer, the above sequence is reversed.

Figure 9:
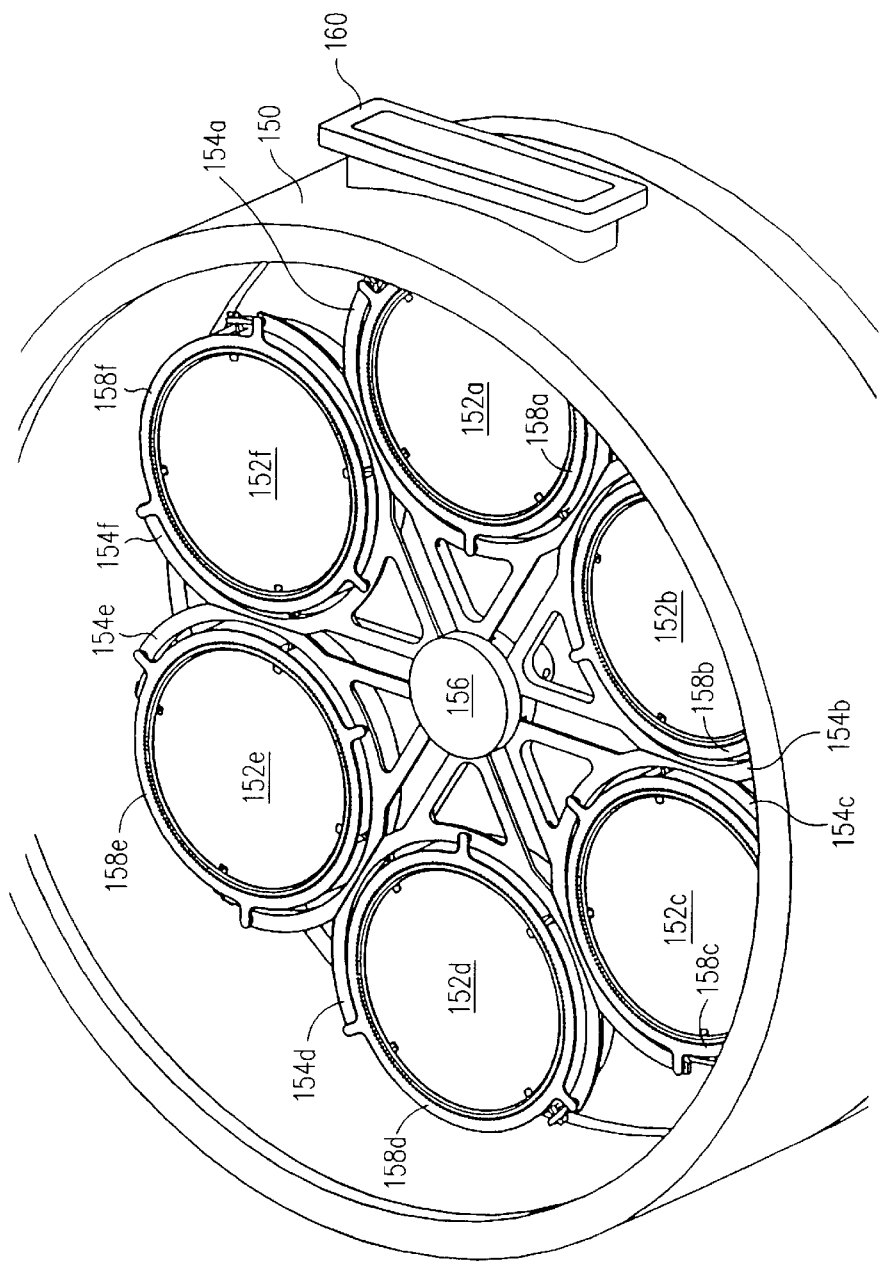
FIG. 9 illustrates a perspective view of a process chamber having six wafer transfer arms of the kind shown in FIG. 8A attached to a central hub.

FIG. 9 illustrates a processing chamber 150 which includes six chucks 152a–152f, each of which represents a separate processing station. Wafer transfer arms 154a–154f, each of them similar to wafer transfer arm 102, are positioned over chucks 152a–152f and are rotated about a hub 156 to transfer wafers from one station to another. Wafer transfer arms 154a–154f can be fabricated separately and attached to hub 156 by a mounting hole 157 (FIG. 8A), or wafer transfer arms 154a–154f can be fabricated as a single unit and mounted on hub 156. Each of wafer transfer arms 154a–154f supports one of exclusion rings 158a–158f in the manner described above. Wafers are introduced into chamber 150 through an input port 160 to the wafer transfer arm 154a which overlies chuck 152a. This can be done by a conventional mechanism such as a robot-driven paddle or fork.

Once a wafer has been introduced to a wafer transfer arm it remains centered with respect to the corresponding exclusion ring. Wafer transfer arms 154a–154f transfer a wafer from station to station by raising the wafer from one station, rotated by hub 156 until the wafer is positioned over another station, and then lowering the wafer onto the latter station. At all times a given wafer remains associated with and supported by a single transfer arm/exclusion ring combination.

FIGS. 10–16 illustrate an embodiment in which the centering wheels are mounted on a carrier ring. Carrier ring 300, which may also function as an exclusion gas or guard ring, has three tongues 302A, 302B and 302C which extend radially outward and are used for mounting holder assemblies 304A, 304B and 304C, respectively (see FIGS. 10 and 11). Holder assemblies 304A, 304B and 304C act as supports for the substrate and contain bearing elements (described below) which perform the alignment function. Tongues 302A–302C are oriented at 120° angles about the center of carrier ring 300.

Figure 11:
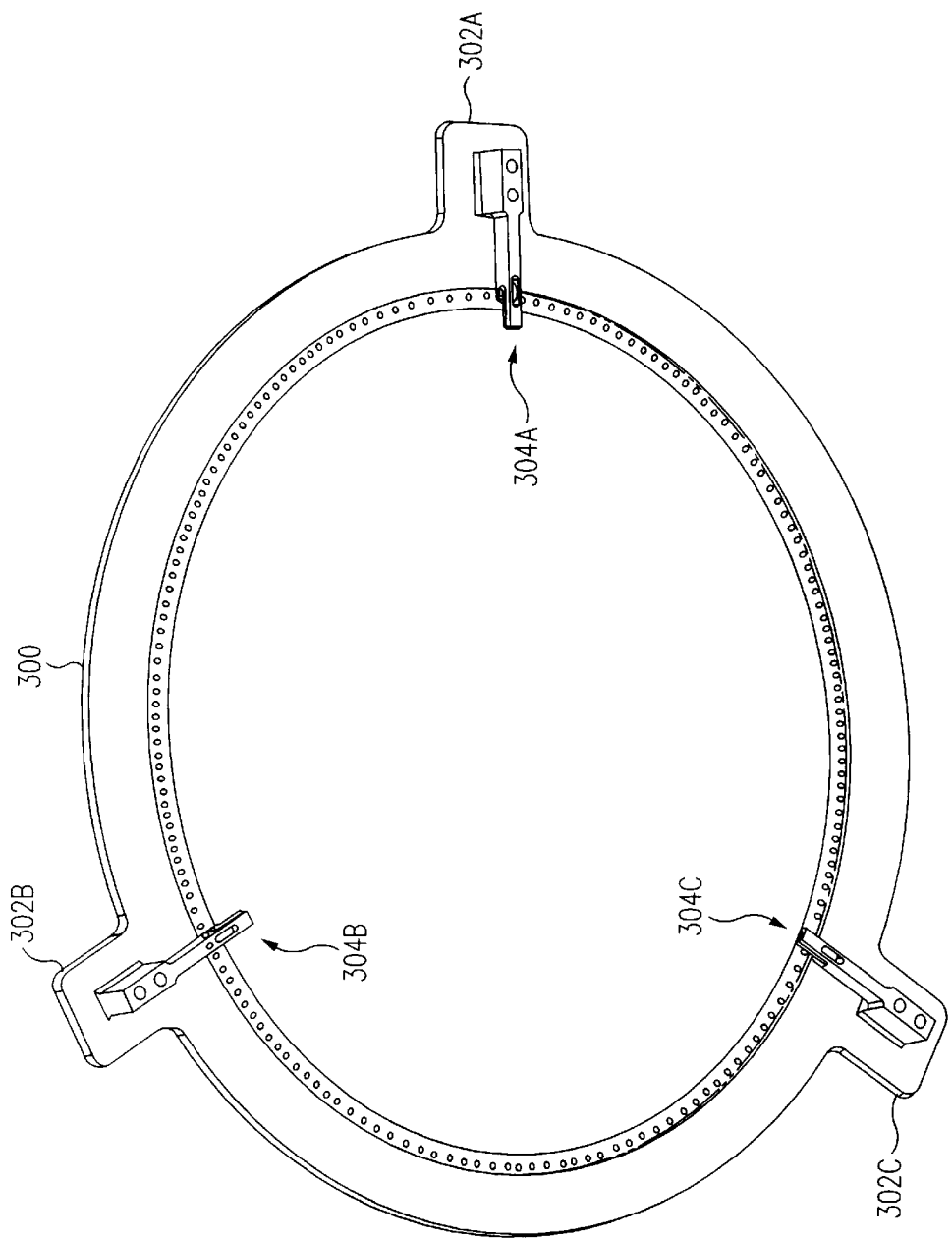
FIG. 11 illustrates a perspective view from the underside of the carrier ring.
Figure 12:
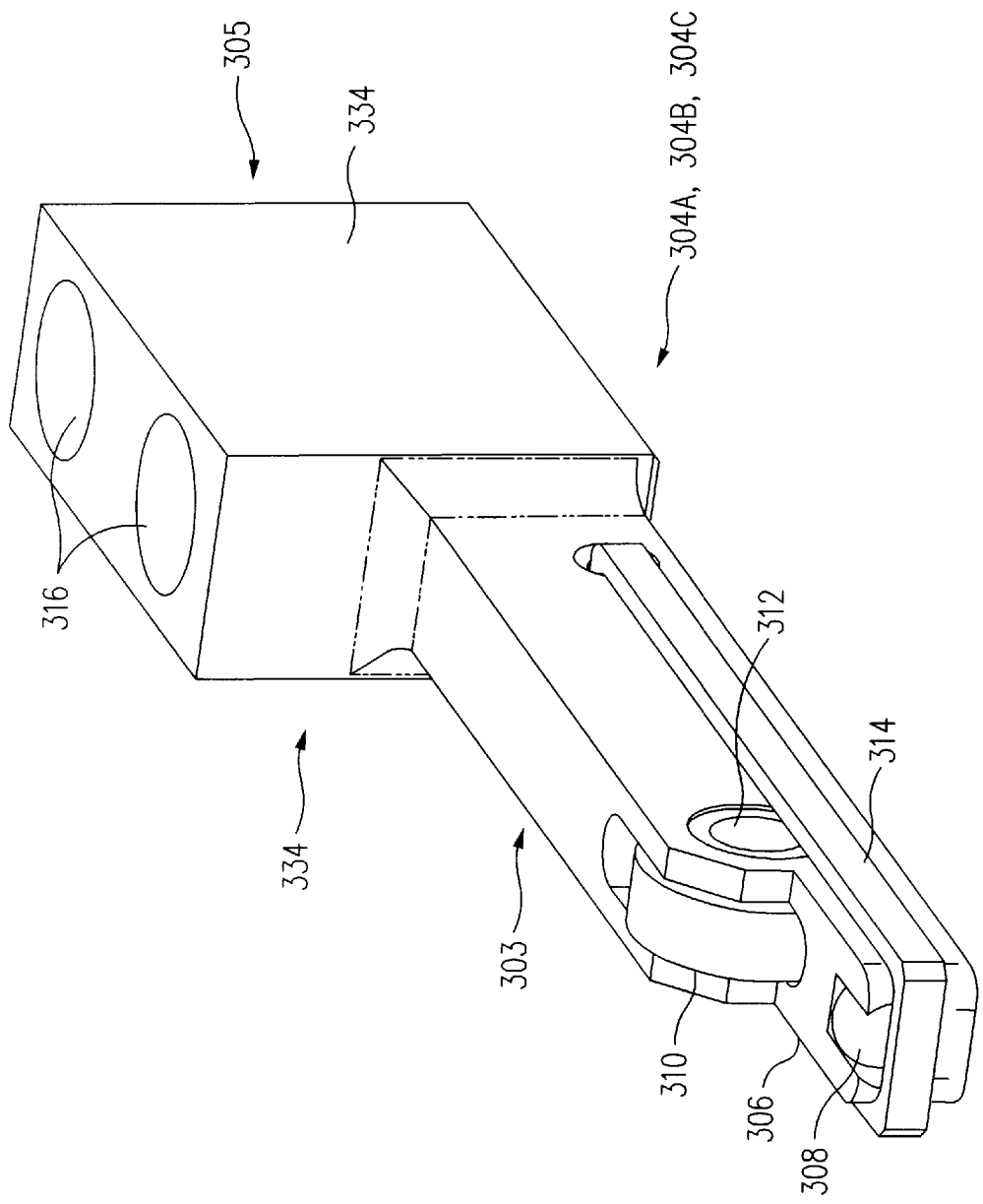
FIG. 12 illustrates a detailed view of the holder assembly, on which the first set of alignment wheels is mounted.
Figure 13:
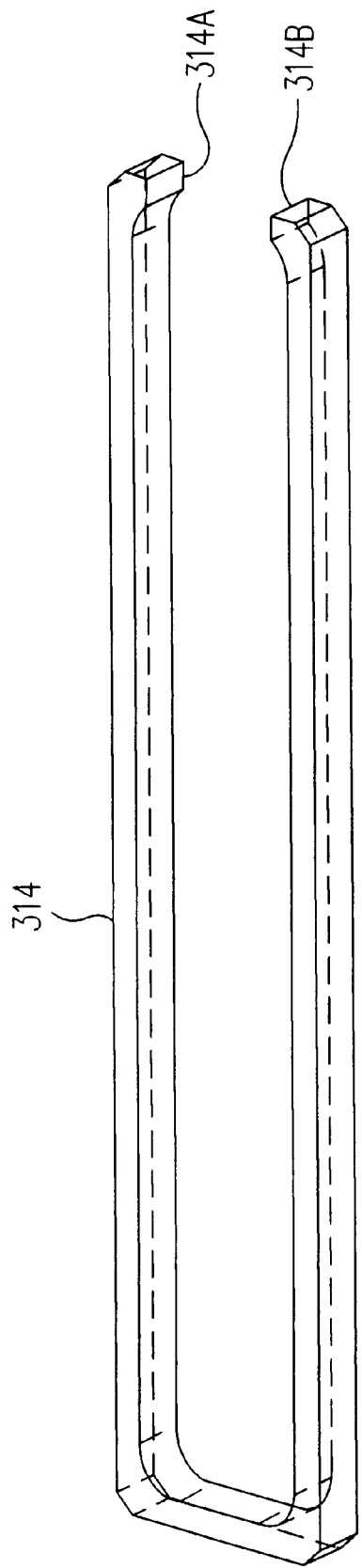
FIG. 13 illustrates a view of the spring clip used to retain the axle and ball in the holder assembly.
Figure 14:
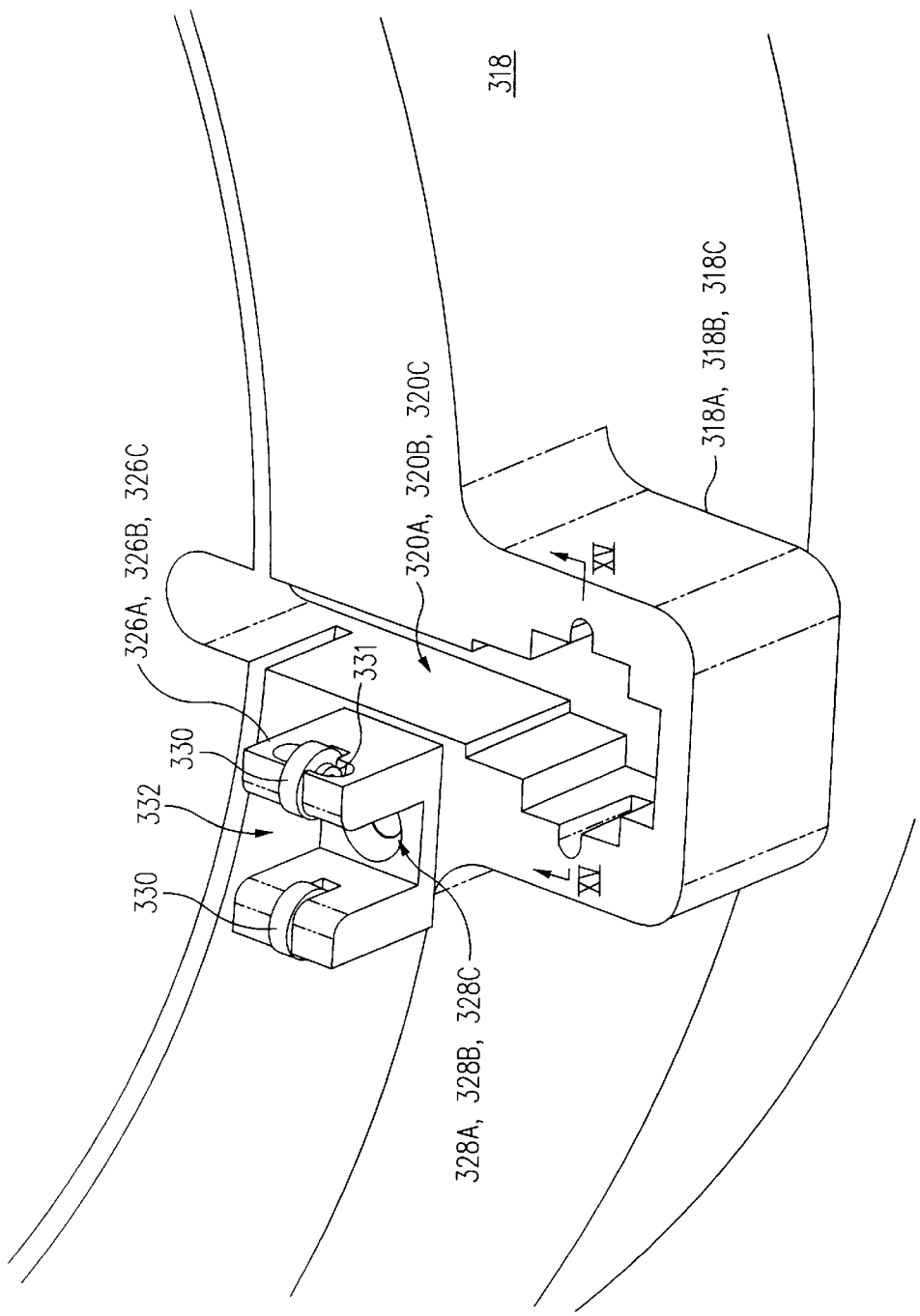
FIG. 14 illustrates a perspective view showing how the wheel block is mounted to the chuck.

A detailed view of holder assemblies 304A–304C is shown in FIG. 12. Each of holder assemblies 304A–304C includes an arm section 303 and a mounting section 305. Within arm section 303, a shelf portion 306 contains a cavity into which a ball 308 is rotatably fitted, and a centering wheel 310 is rotatably mounted on an axle 312. Ball 308 and axle 312 are retained in place by a spring clip 314 (FIG. 13) whose ends 314A and 314B fit into depressions formed in the sides of arm section 303. Spring clip 314 is not in tension when installed in holder assemblies 304A–304C and is therefore not subject to relaxation or loss of retaining force when exposed to high temperatures. Within mounting section 305, threaded holes 316 are provided for mounting holder assemblies 304A–304C by means of screws 317 to the undersides of tongues 302A–302C, as shown in FIG. 11.

Wheels 310 and axles 312 are of the jewel-bearing type, which provides very low frictional forces. Balls 308 are also of the jewel-bearing type, and likewise provide very low frictional resistance to the lateral translation of the substrate during the alignment process. This low friction is important to getting the arrangement to operate with the weight of the substrate as the only input force.

Figure 10:
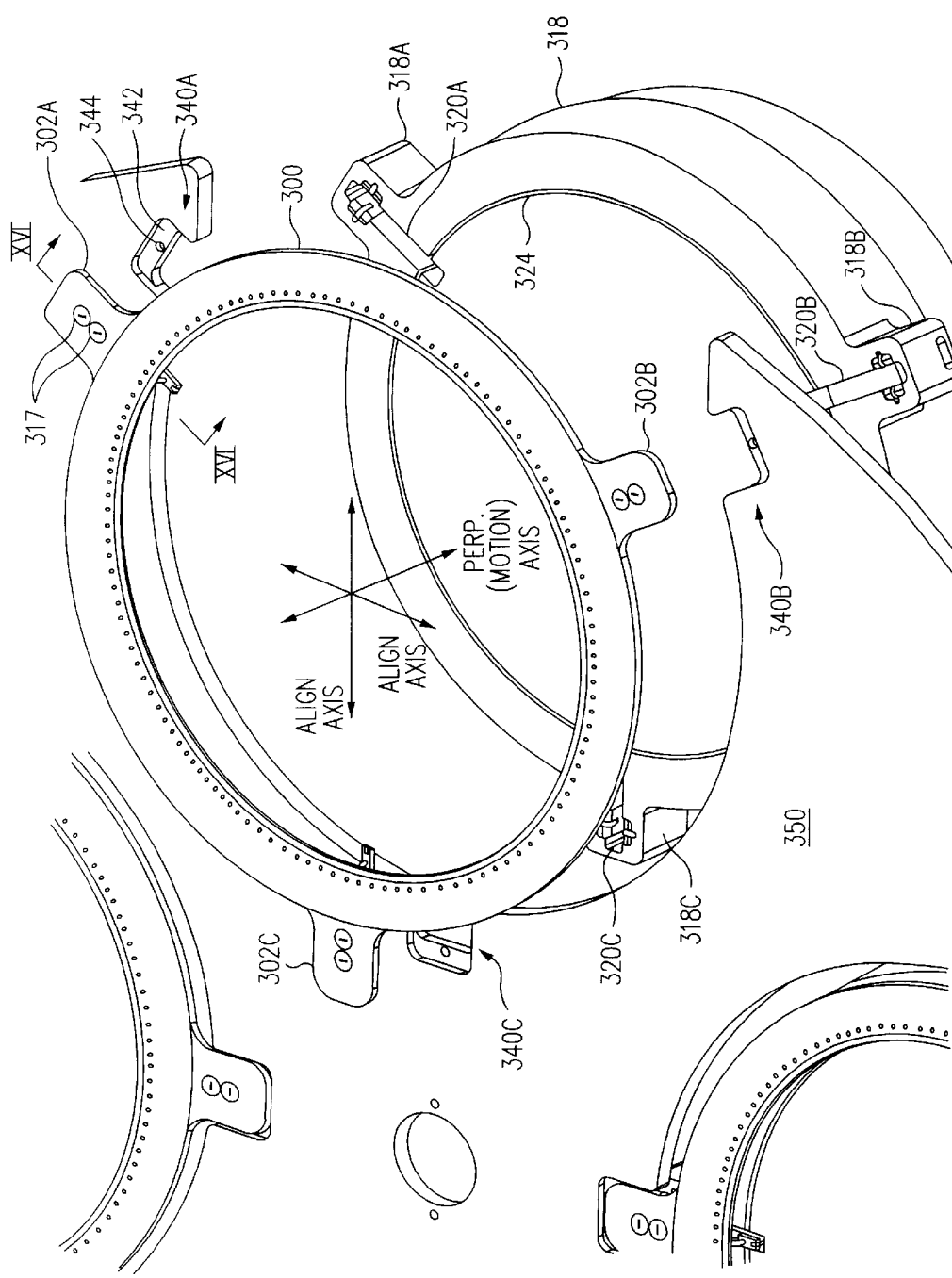
FIG. 10 illustrates a perspective view of a fifth embodiment of the invention, in which a first set of alignment wheels mounted to a carrier ring is used to align the substrate with respect to the carrier ring and a second set of alignment wheels mounted to the chuck is used to align the carrier ring with respect to the plate.

As shown in FIG. 10, chuck 318 includes a groove 324 for introducing exclusion gas, and mounting blocks 318A, 318B and 318C, which are positioned below tongues 302A, 302B and 302C. The exclusion gas flows out of groove 324 and between the inside edge of carrier ring 300 and chuck 318 in the manner described in the above-referenced U.S. Pat. No. 5,620,525. Slots 320A, 320B and 320C extend radially across groove 324 and into mounting blocks 318A, 318B and 318C, respectively, and are oriented at 120° angles with respect to the center of chuck 318. As shown in the detailed view of FIG. 14, wheel blocks 326A, 326B and 326C are mounted into slots 320A, 320B and 320C, respectively, by means of screws (not shown) which are fitted through holes 328A, 328B and 328C into threaded holes in mounting blocks 318A, 318B and 318C. Within each of wheel blocks 326A, 326B and 326C are a pair of sapphire bearing type wheels 330 mounted on axles 331 on the opposite sides of a channel 332.

Figure 15:
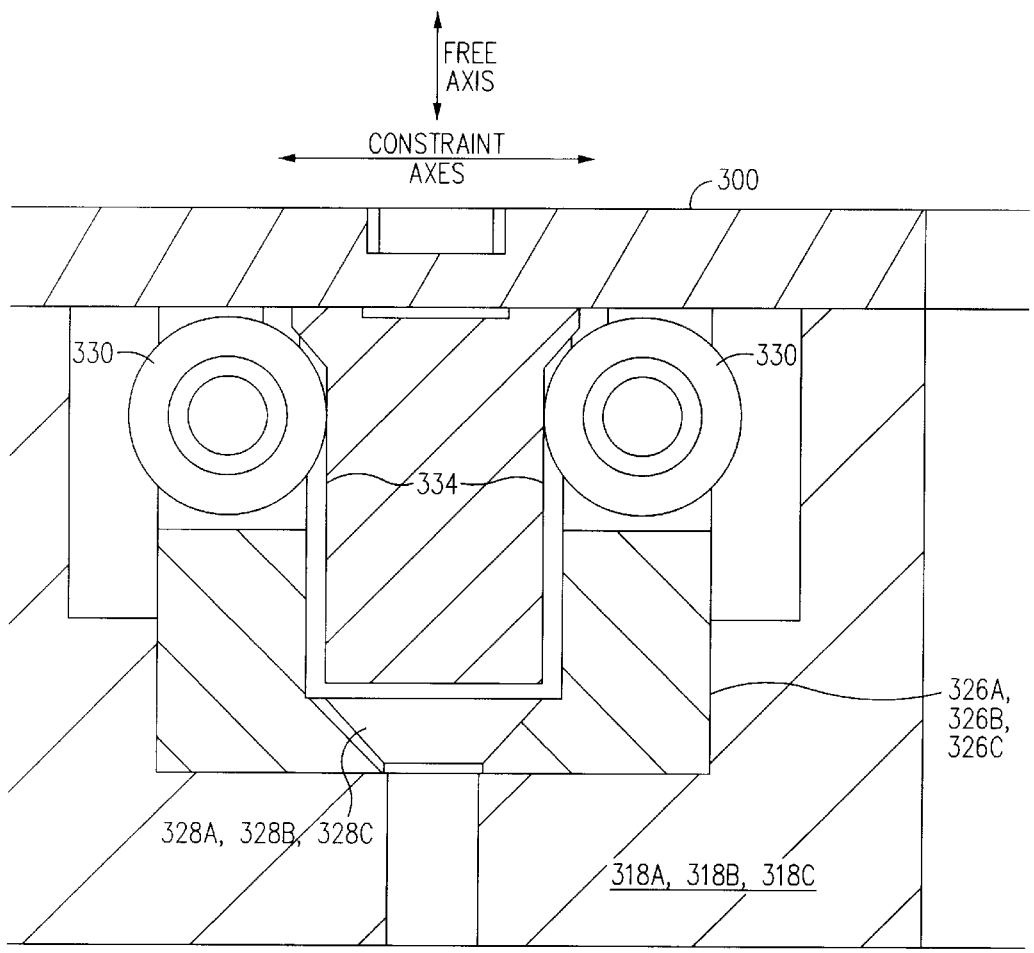
FIG. 15 illustrates a cross-sectional view of the wheel block mounted in the chuck.

Each of holder assemblies 304A–304C contains a pair of alignment faces 334 which are parallel to each other and which make contact with wheels 330 as carrier ring 300 is lowered to the surface of chuck 318. FIG. 15 shows a cross-sectional view, taken at cross-section XV shown in FIG. 14, of wheels 330 in contact with alignment faces 334 after carrier ring 300 has been lowered to chuck 318.

Using this arrangement a circular substrate is accurately positioned with respect to the carrier ring 300 and the carrier ring 300 is in turn accurately positioned with respect to the chuck 318. First, the substrate is brought to a position below the carrier ring 300 but above the shelf portions 306 of holder assemblies 304A–304C. Holder assemblies 304A–304C are positioned such that the diameter of the substrate can pass between adjacent ones of holder assemblies 304A–304C. Next the substrate is lowered along the perpendicular motion axis (see FIG. 10) and makes contact with the wheels 310, which are positioned such that their inside edges form a circle having approximately the same diameter as the substrate. These steps can be accomplished by conventional means such as a paddle or similar device. As described above, the weight of the substrate either causes the wheels 310 to turn or causes the edge of the substrate to slide against the wheels 310. In either case, the substrate is guided by the wheels 310 until it is accurately centered with respect to the carrier ring 300 after it has come to rest on the balls 308, which allow for additional lateral shifting of the substrate. This lateral motion takes place such that the substrate is fully constrained with respect to the two perpendicular alignment axes shown in FIG. 10. Next, carrier ring 300 is lowered along the perpendicular motion axis towards the chuck, and the alignment faces 334 make contact with the wheels 330, thereby properly aligning carrier ring 300 and chuck 318 with respect to the two horizontal alignment axes. This occurs before the substrate has reached the surface of the chuck. Thus, when the substrate reaches the surface of the chuck where it can be vacuum-clamped to the chuck, and carrier ring 300 and the substrate are already accurately aligned to the chuck. The substrate is accurately aligned with both the chuck and carrier ring when it is vacuum-clamped to the chuck. The alignment of the carrier ring to the chuck is accomplished by means of the motion of the carrier ring along the third perpendicular axis, using the weight of the carrier ring as only input force. The orientation of the alignment faces 334 and the channels 332 radially with respect to the center of the chuck assures proper alignment between the carrier ring and the chuck even in the event that differential thermal expansion occurs between these two components as the temperature of the system varies. This is particularly important in systems (as described below) which include multiple chucks operating at different temperatures due to process considerations. It also allows the system to be set up and checked out "cold" (15°–20° C.) while assuring proper alignment at operating temperatures, which may exceed 400° C. In fact, the system should perform at temperatures up to 1600° C., the maximum use temperature of aluminum oxide.

Figure 16A:
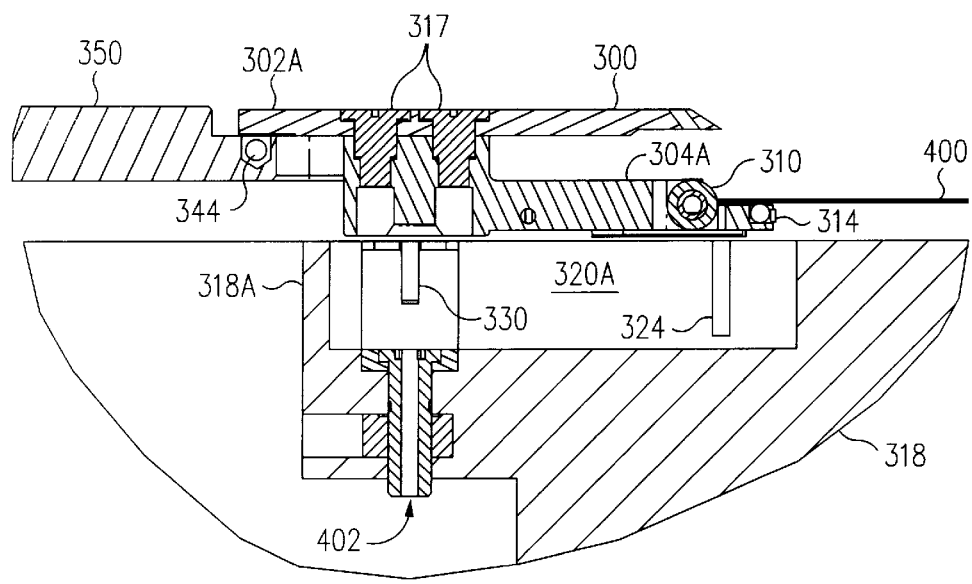
FIGS. 16A and 16B illustrate cross-sectional views showing how a substrate is lowered into alignment with a chuck.
Figure 16B:
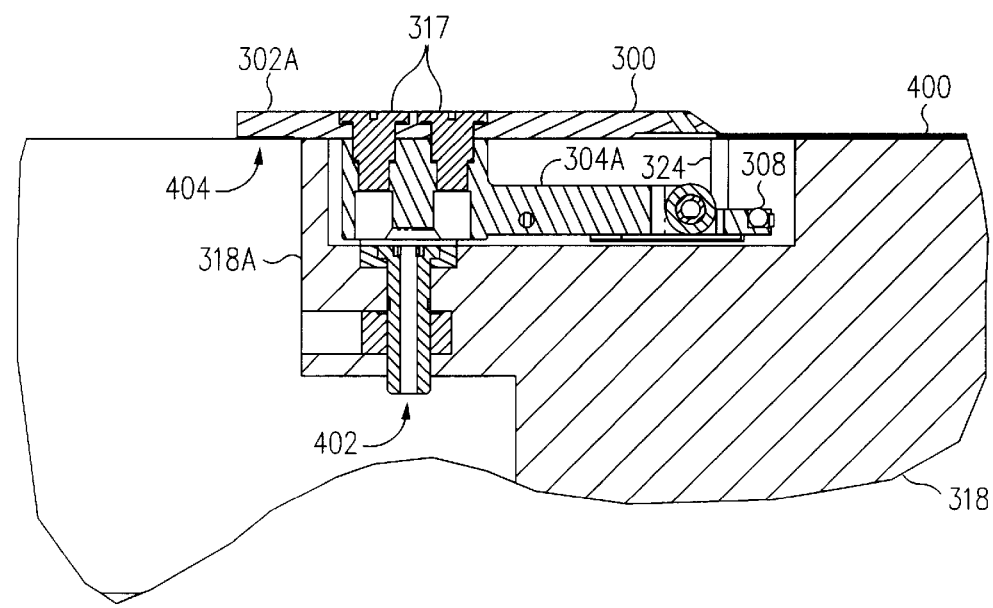

FIG. 16A illustrates a cross-sectional view, taken at section XVI in FIG. 10, which shows the carrier ring 300 in a raised position, with a substrate 400 resting on one of the balls 308 and aligned by the wheels 310, before the substrate has been lowered to the top surface of the chuck 318. FIG. 16B illustrates a similar cross-sectional view after the carrier ring 300 and substrate 400 have come to rest of the chuck 318 and the holder assembly 304A has been depressed in the slot 320A. FIGS. 16A and 16B also show a guide hole 402 for a lift pin (not shown) that is used along with similar pins under tabs 302B and 302C to lower and lift ring carrier 300 to and from the surface of chuck 318. The tips of the lift pins contact a groove that is formed in the bottom surfaces of the holder assemblies.

Figure 17:
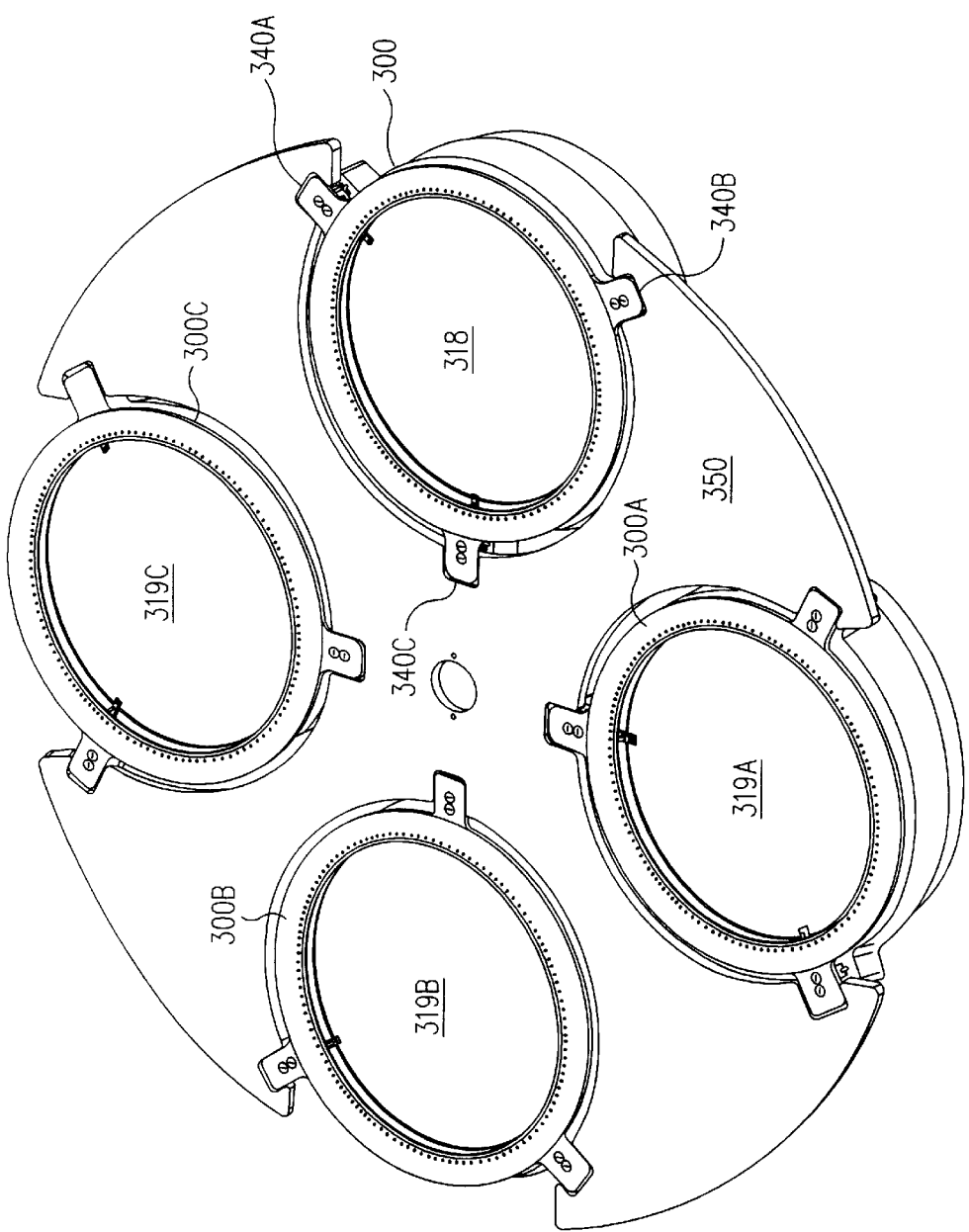
FIG. 17 illustrates a partial perspective view of a multi-station processing device containing alignment arrangements in the fifth embodiment of this invention.

Carrier ring 300 is advantageously used with a plurality of similar carrier rings in a multistation processing unit of the kind shown in the partial view of FIG. 17. Tongues 302A, 302B and 302C are shaped to fit into notches 340A, 340B and 340C which are formed in a rotatable lift plate 350, with the tip of each of the tongues being supported on a shelf 342 in which is mounted a ball 344 (see FIG. 10). Ball 344 acts as a thermal barrier to minimize heat loss to the lift plate 350, and also as a "coarse alignment" to prevent the carrier ring from slipping out of the capture range. Ball 344 and similar balls in notches 340B and 340C fit within radial grooves 404 (see FIG. 16B) that are machined in the undersides of tongues 302A–302C to provide a coarse alignment of carrier ring 300. As lift plate 350 rotates, carrier rings 300, 300A, 300B and 300C are transferred between the processing stations represented by chucks 318, 319A, 319B and 319C, one of which would typically also serve as a loading station. Lift plate 350 first lifts the carrier rings and substrates at one processing station, rotates so as to move the carrier rings and substrates to the next process station, and then lowers the carrier rings and substrates at that station. During this movement, the alignment of the substrates with their respective carrier rings is not disturbed. Note that the positioning of the tongues of the carrier rings in the notches of the lift plate 350 only prevents gross misalignment of the carrier rings and the respective chucks. Accurate alignment occurs when the lift plate 350 lowers the carrier rings and holder assemblies into the respective radial slots in the chucks, where the alignment faces (e.g., alignment faces 334) make contact with the wheels in each of the wheel blocks. As shown in FIG. 10, notches 304A–304C conform to the shapes of mounting blocks 318A–318C thereby allowing the lift plate 350 to lower the carrier rings to the surface of the chuck 318 (as shown in FIG. 16B). Thus the substrates and carrier rings are accurately aligned with the chucks following each transfer between processing stations, provided that the lift plate does not undergo any motion that would dislodge the substrates in the third, unconstrained axis. Lift pins which extend through guide holes such as guide hole 402 (FIGS. 16A and 16B) can be used to lift the carrier rings independently of the lift plate 350. This capability is useful, for example, in the loading station where the carrier ring can be lifted to allow an external robot to insert a new substrate into the multistation unit without disturbing the processing of substrates at the other stations.

Furthermore, the lack of constraint in the third (perpendicular) axis allows the substrate to be placed on pins or some other device as well as another chuck while the carrier ring is moved to another location along this third axis. The ring carrier, when used as an exclusion gas or guard ring, can be adjusted so as to vary the vertical distance between the ring and the substrate during the actual processing step. The compact vertical dimensions of the arrangement allow it to be used conveniently is situations where limited space is available, such as within a CVD chamber where the separation between a "showerhead" type of gas supply structure and the chuck must be minimized.

The various parts of this arrangement should be constructed with materials that add to its operation, longevity and ability to withstand extreme environments. The majority of the components may be constructed of polycrystalline aluminum oxide (alumina) or single crystal aluminum oxide (sapphire). These materials exhibit outstanding dimensional stability, high hardness and stiffness, a very good strength-to-weight ratio, and excellent resistance to corrosion from plasma or harsh active gas environments. In addition, sapphire has a very low coefficient of friction and can be polished to a very fine finish with tight dimensional control. A sapphire-on-sapphire bearing will operate for a large number of cycles without lubrication in very harsh (corrosive) environments. Likewise, alumina can be ground to very tight tolerances and has the ability to accept features requiring complex machining operations not possible with some other materials. In some embodiments $ZrO_2$ or SiC is added to the aluminum oxide in the form of an alloy or composite. As an alternative, AlN or other ceramics or alloys of ceramics could be used in place of aluminum oxide.

In one embodiment the only components not made of sapphire or alumina are the spring washer that is used to prevent loosening of the holder/carrier assembly during thermal cycles and the wheel blocks which are made of the same material as the chuck to minimize a thermal mismatch.

Arrangements according to this invention are particularly useful in many processes where the uniformity of deposition and/or etching is affected by the relative positions of the components. In addition, some processes require exclusion of the process gas entirely from the edge of the substrate, which is virtually impossible to control without accurate alignment of the components. The ability to move the carrier ring along the third, perpendicular axis is a significant benefit, particularly when it is used as a guard ring, since the separation between the guard ring and the substrate is often a critical parameter during processing.

The above described embodiments of the present invention should be interpreted as illustrative only and not as limiting the scope the present invention. For example, although the embodiments include an exclusion gas ring, the invention can also be used to accurately position a substrate in processing equipment which does not include an exclusion gas ring. While the embodiments shown include three or four substrate-aligning wheels (or wheel pairs), other embodiments may include a different number of wheels. Finally, while the embodiments described above generally involve the centering of a circular wafer or substrate, this invention also has application to the alignment of substrates of various non-circular shapes, provided that the alignment wheels are oriented so as to define a desired location of the substrate. While the alignment wheels are shown as being generally cylindrical, other shapes which could function as guidance devices, e.g., spheres, could be used.

We claim:

1. Apparatus for aligning a flat substrate with respect to another body, said apparatus comprising:

at least three rotatable wheels mounted on horizontal axles, each of the wheels being rotatable independently of the other wheels, respective edges of said wheels defining a shape substantially congruent with the shape of said flat substrate, said axles being positioned substantially in the same plane and each of the axles being aligned substantially parallel to an edge of said substrate to be contacted by the wheel mounted on said axle;

a body to which said flat substrate is to be aligned, said body having a supporting surface for supporting said flat substrate, said supporting surface being positioned generally in an area between said wheels; and a mechanism for lowering said flat substrate from a position above said wheels to a position wherein a peripheral region of said flat substrate makes contact with at least two of said wheels.

2. The apparatus of claim 1, wherein said wheels are generally cylindrical.

3. A processing chamber for performing a process on a flat circular substrate and containing a chuck for supporting said flat circular substrate during said processing, said chamber further comprising an arrangement for aligning said flat circular substrate on said chuck, said arrangement comprising:

at least three rotatable wheels mounted on horizontal axles on said chuck, each of the wheels being rotatable independently of the other wheels, respective edges of said wheels defining a shape substantially congruent with the shape of said flat circular substrate, said axles being positioned substantially in the same plane and each of the axles being aligned substantially parallel to an edge of said flat circular substrate to be contacted by the wheel mounted on said axle; and a mechanism for lowering said substrate from a position above said wheels to a position wherein a peripheral region of said flat circular substrate makes contact with at least two of said wheels.

4. The processing chamber of claim 3 wherein said wheels are mounted to said chuck.

5. The processing chamber of claim 4 wherein said wheels are mounted to said chuck by means of wheel holders.

6. The processing chamber of claim 4 wherein one end of each of said axles is mounted to said chuck, the other end of each of said axles remaining free.

7. The processing chamber of claim 6 wherein each of said axles is flexible.

8. The processing chamber of claim 4 wherein both ends of each of said axles is mounted to said chuck.

9. The processing chamber of claim 8 wherein each of said axles is flexible.

10. The processing chamber of claim 4 further comprising an exclusion gas ring, said exclusion gas ring being positioned such that said exclusion gas ring is centered above said flat circular substrate when said substrate is supported on said chuck.

11. The processing chamber of claim 4 comprising four of said wheels.

12. The processing chamber of claim 3 wherein said wheels are mounted to a substrate transfer arm.

13. The processing chamber of claim 12 further comprising an exclusion gas ring, said substrate transfer arm containing a first set of features, said exclusion gas ring containing a second set of features, said first and second sets of features being shaped and sized so as to correctly align said exclusion gas ring and said substrate transfer arm when said first and second sets of features are mated together.

14. The processing chamber of claim 13 wherein said first set of features comprises a plurality of pins and said second set of features comprises a plurality of slots, said slots being oriented radially with respect to a center of said exclusion gas ring when said pins and slots are mated together.

15. The processing chamber of claim 12 comprising a plurality of lips for supporting said substrate, each of said lips being located adjacent at least one of said wheels.

16. The processing chamber of claim 12 wherein a pair of wheels is located adjacent each of said lips.

17. The processing chamber of claim 12 comprising a mechanism for lowering said substrate transfer arm such that a substrate comes to rest on a supporting surface of said chuck.

18. The processing chamber of claim 12 comprising a plurality of processing stations, said substrate transfer arm being configured so as to transfer a substrate from a first processing station to a second processing station.

19. The processing chamber of claim 18 wherein said processing chamber comprises a chemical vapor deposition chamber.

20. The processing chamber of claim 18 wherein said processing chamber comprises a plasma-enhanced chemical vapor deposition chamber.

21. A processing chamber for performing a process on a substrate while said substrate is supported on a chuck, said chamber comprising:

said chuck, said chuck having a supporting surface for supporting a central region of said substrate;

a carrier ring comprising:
a first plurality of wheels rotatable about respective horizontal axes, said first plurality of wheels having edges which define a shape congruent with a shape of said substrate; and
a plurality of shelf portions for supporting a peripheral region of said substrate; and an alignment mechanism for aligning said carrier ring to said chuck, said alignment mechanism comprising a second plurality of wheels and a plurality of alignment faces, respective ones of said alignment faces contacting one of said second plurality of wheels when said carrier ring is aligned to said chuck.

22. The processing chamber of claim 21 comprising a rotatable ball mounted in each of said shelf portions.

23. The processing chamber of claim 21 wherein said alignment faces are formed in said carrier ring and said second plurality of wheels are mounted in said chuck.

24. The processing chamber of claim 23 wherein said second plurality of wheels are mounted in pairs on opposite sides of channels, said channels being oriented radially in said chuck.

25. The processing chamber of claim 21 comprising a plurality of processing stations, said carrier ring being supported on a lift plate, said lift plate being for transporting said ring carrier from a first processing station to a second processing station.

26. The processing chamber of claim 21 wherein said chuck comprises a groove for introducing an exclusion gas.

27. The processing chamber of claim 26 wherein said carrier ring comprises an exclusion gas ring.

* * * * *